United States Patent
Rajaee (10) Patent No.: US 8,970,304 B2
(45) Date of Patent: Mar. 3, 2015

(54) HYBRID AMPLIFIER

(71) Applicant: QUALCOMM Incorporated, San Diego, CA (US)

(72) Inventor: Omid Rajaee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 6 days.

(21) Appl. No.: 13/740,013

(22) Filed: Jan. 11, 2013

(65) Prior Publication Data

US 2014/0197888 A1 Jul. 17, 2014

(51) Int. Cl.
*H03F 3/45* (2006.01)

(52) U.S. Cl.
CPC ........ *H03F 3/45376* (2013.01); *H03F 3/45188* (2013.01); *H03F 2203/45301* (2013.01); *H03F 2203/45311* (2013.01); *H03F 2203/45371* (2013.01); *H03F 2203/45661* (2013.01)
USPC ....................................................... 330/261

(58) Field of Classification Search
USPC ................................................. 330/252–261
See application file for complete search history.

(56) References Cited

U.S. PATENT DOCUMENTS

| 5,294,893 | A | * | 3/1994 | Ryat ............................. 330/258 |
| 5,880,637 | A | | 3/1999 | Gonzalez |
| 6,373,337 | B1 | | 4/2002 | Ganser |
| 6,476,675 | B1 | | 11/2002 | Sun |
| 7,138,866 | B2 | | 11/2006 | Etoh |
| 7,907,011 | B2 | | 3/2011 | Chung |
| 8,339,200 | B2 | * | 12/2012 | Wong ............................. 330/253 |
| 8,625,014 | B2 | * | 1/2014 | Yoo et al. ....................... 348/300 |
| 2003/0006842 | A1 | | 1/2003 | Turudic et al. |
| 2007/0229154 | A1 | | 10/2007 | Kim et al. |
| 2011/0291760 | A1 | | 12/2011 | Maruyama |
| 2012/0286874 | A1 | | 11/2012 | Kim et al. |

FOREIGN PATENT DOCUMENTS

| WO | 02091569 A1 | 11/2002 |
| WO | 2007063409 A1 | 6/2007 |

OTHER PUBLICATIONS

Gulati K et al., "A High-Swing CMOS Telescopic Operational Amplifier", IEEE Journal of Solid-State Circuits, IEEE Service Center, Piscataway, NJ, USA, Dec. 1, 1998, XP011060888, ISSN: 0018-9200, vol. 33, No. 12, pp. 2010-2019 the whole document.

(Continued)

*Primary Examiner* — Hieu Nguyen
(74) *Attorney, Agent, or Firm* — Ramin Mobarhan (57) ABSTRACT

Exemplary embodiments are directed to systems, devices, and methods for enhancing a telescopic amplifier. An amplifier may include a differential pair of input transistors including at least one transistor configured to receive a first input and at least one other transistor configured to receive a second input. The amplifier may further include a cascode circuit including a first pair of transistors coupled to the at least one transistor of the differential pair to form a first plurality of current paths configured to generate a first output. The cascode circuit may also include a second pair of transistors coupled to the at least one other transistor of the differential pair to form a second plurality of currents paths configured to generate a second output.

19 Claims, 9 Drawing Sheets

(56) References Cited

OTHER PUBLICATIONS

International Search Report and Written Opinion—PCT/US2014/011165—ISA/EPO—Jun. 2, 2014.
Italia A et al., "A variable-gain image-reject down-converter for 5-6 GHz WLAN applications", Radio Frequency Integrated Circuits (RFIC) Symposium, 2004. Digest of Papers. 2004 IEEE Fort Worth, TX, USA Jun. 6-8, 2004, Piscataway, NJ, USA, IEEE, Jun. 6, 2004, XP010713754, DOI: 10.1109/RFIC.2004.1320554, ISBN: 978-0-7803-8333-3, pp. 149-152.
Tran H et al., "6-K0MEGA 43-GB/S Differential Transimpedance-Limiting Amplifier With Auto-Zer0 Feedback and High Dynamic Range", IEEE Journal of Solid-State Circuits, IEEE Service Center, Piscataway, NJ, USA, Oct. 1, 2004, XP001224779, ISSN: 0018-9200, D0I: 10.1109/JSSC.2004.833547, vol. 39, No. 10, pp. 1680-1689.

\* cited by examiner

HYBRID AMPLIFIER

BACKGROUND

1. Field

The present invention relates generally to a telescopic amplifier. More specifically, the present invention relates to methods and devices for increasing a gain of a telescopic amplifier.

2. Background

Amplifiers are commonly used in various electronic devices to provide signal amplification. Various types of amplifiers are available and include voltage amplifiers, current amplifiers, etc. A voltage amplifier receives and amplifier an input voltage signal and provides an output voltage signal. A current amplifier receives and amplifier an input current signal and provides an output current signal. Amplifiers typically have different designs and are used in different applications. For example, a wireless communication device such as a cellular phone may include a transmitter and a receiver for bi-directional communication. The transmitter may utilize a driver amplifier (DA) and a power amplifier (PA), the receiver may utilize a low noise amplifier (LNA), and the transmitter and receiver may utilize variable an amplifiers (VGAs).

Telescopic amplifiers, which may include simple architectures and high bandwidths, are a desirable choice for many applications. As will be appreciated by a person having ordinary skill in the art, increasing a DC gain of a telescopic amplifier (e.g., via gain boosting, using longer channel length for devices, triple cascoding, etc.) may require a power and/or an area penalty.

A need exists for increasing a gain of a telescopic amplifier. More specifically, a need exists for devices and methods for increasing a gain of a telescopic amplifier without increasing the power consumption and/or the size of the telescopic amplifier.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Exemplary embodiments of the present invention, as described herein, relate to a hybrid telescopic/folded cascode amplifier. According to one exemplary embodiment, the amplifier may include an input device including a differential pair of transistors. The amplifier may also include a cascode device including a first pair of transistors coupled to a first transistor of the differential pair and a second pair of transistors coupled to a second transistor of the differential pair. Each transistor of the cascode device may share a common gate bias voltage.

Figure 1:
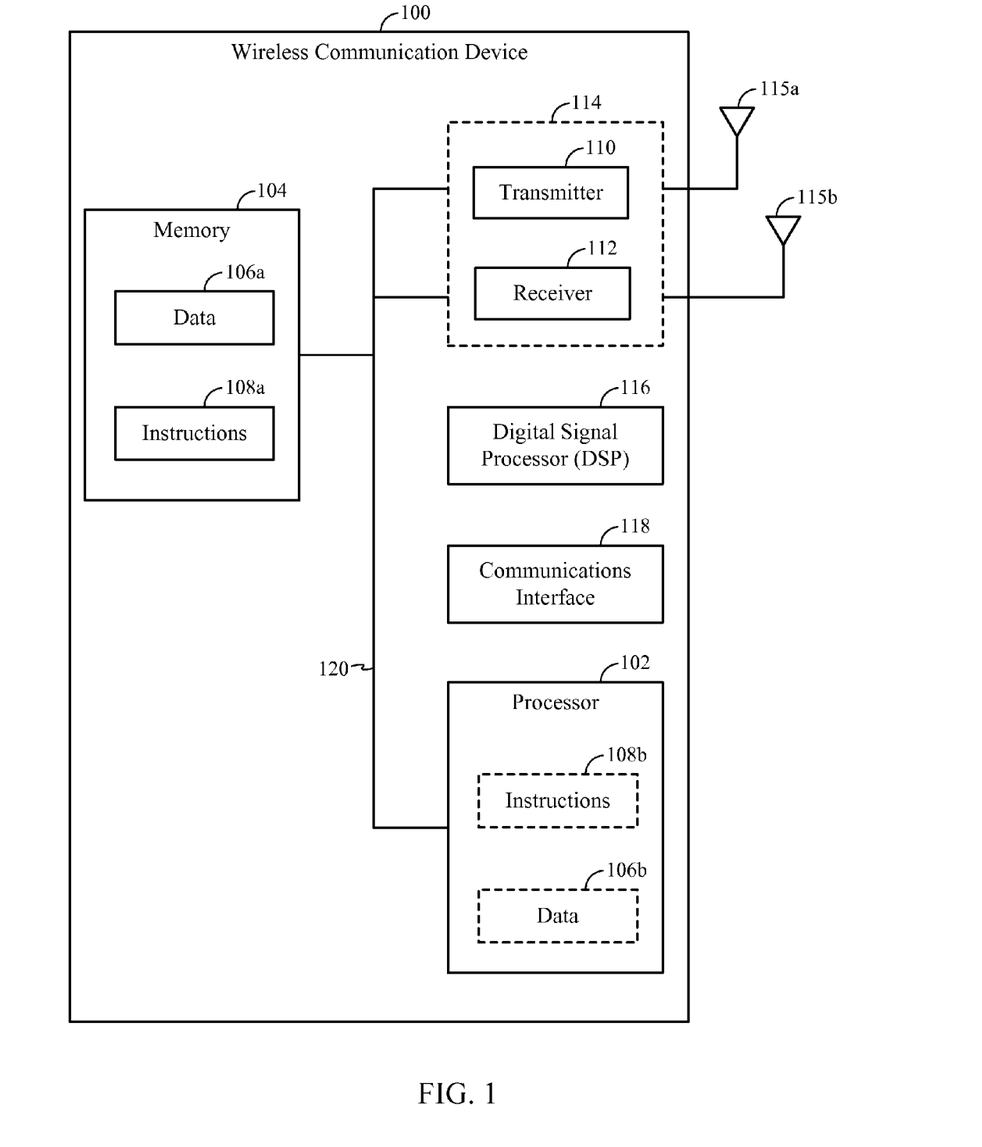
FIG. 1 illustrates a wireless communication device, according to an exemplary embodiment of the present invention.

FIG. 1 illustrates a wireless communication device 100, according to an exemplary embodiment of the present invention. Wireless communication device 100 may be an access terminal, a mobile station, a user equipment (UE), etc. Wireless communication device 100 includes a processor 102. Processor 102 may be a general purpose single or multi-chip microprocessor (e.g., an ARM), a special purpose microprocessor (e.g., a digital signal processor (DSP)), a microcontroller, a programmable gate array, etc. Processor 102 may be referred to as a central processing unit (CPU). Although just a single processor 102 is shown in wireless communication device 100 of FIG. 1, in an alternative configuration, a combination of processors (e.g., an ARM and DSP) could be used.

Wireless communication device 100 also includes memory 104. Memory 104 may be any electronic component capable of storing electronic information. Memory 104 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 106a and instructions 108a may be stored in memory 104. Instructions 108a may be executable by the processor 102 to implement the methods disclosed herein. Executing the instructions 108a may involve the use of data 106a that is stored in memory 104. When processor 102 executes instructions 108, various portions of the instructions 108b may be loaded onto processor 102, and various pieces of data 106b may be loaded onto processor 102.

Wireless communication device 100 may also include a transmitter 110 and a receiver 112 to allow transmission and reception of signals to and from wireless communication device 100 via a first antenna 115a and a second antenna 115b. Transmitter 110 and receiver 112 may be collectively referred to as a transceiver 114. Wireless communication device 100 may also include (not shown) multiple transmitters, additional antennas, multiple receivers and/or multiple transceivers.

Wireless communication device 100 may include a digital signal processor (DSP) 116. Wireless communication device 100 may also include a communications interface 118. Communications interface 118 may allow a user to interact with wireless communication device 100.

The various components of wireless communication device 100 may be coupled together by one or more buses, which may include a power bus, a control signal bus, a status signal bus, a data bus, etc. For the sake of clarity, the various buses are illustrated in FIG. 1 as a bus system 120.

It is noted that wireless communication device 100 may include one or more of amplifier 300 as described below with reference to FIG. 3, one or more of amplifier 500 as described below with reference to FIG. 6, one or more of amplifier 700 as described below with reference to FIG. 8, or any combination thereof. It is further noted that wireless communication device 100 is an only an exemplary implementation of a wireless communication device and the invention may include other wireless communication devices configurations. Further, according to one exemplary embodiment of the present invention, one or more of the amplifiers described herein may implemented within one or more of an analog-to-digital converter (ADC), an electronic filter, and a power management circuit of a device (e.g., wireless communication device 100).

Figure 2:
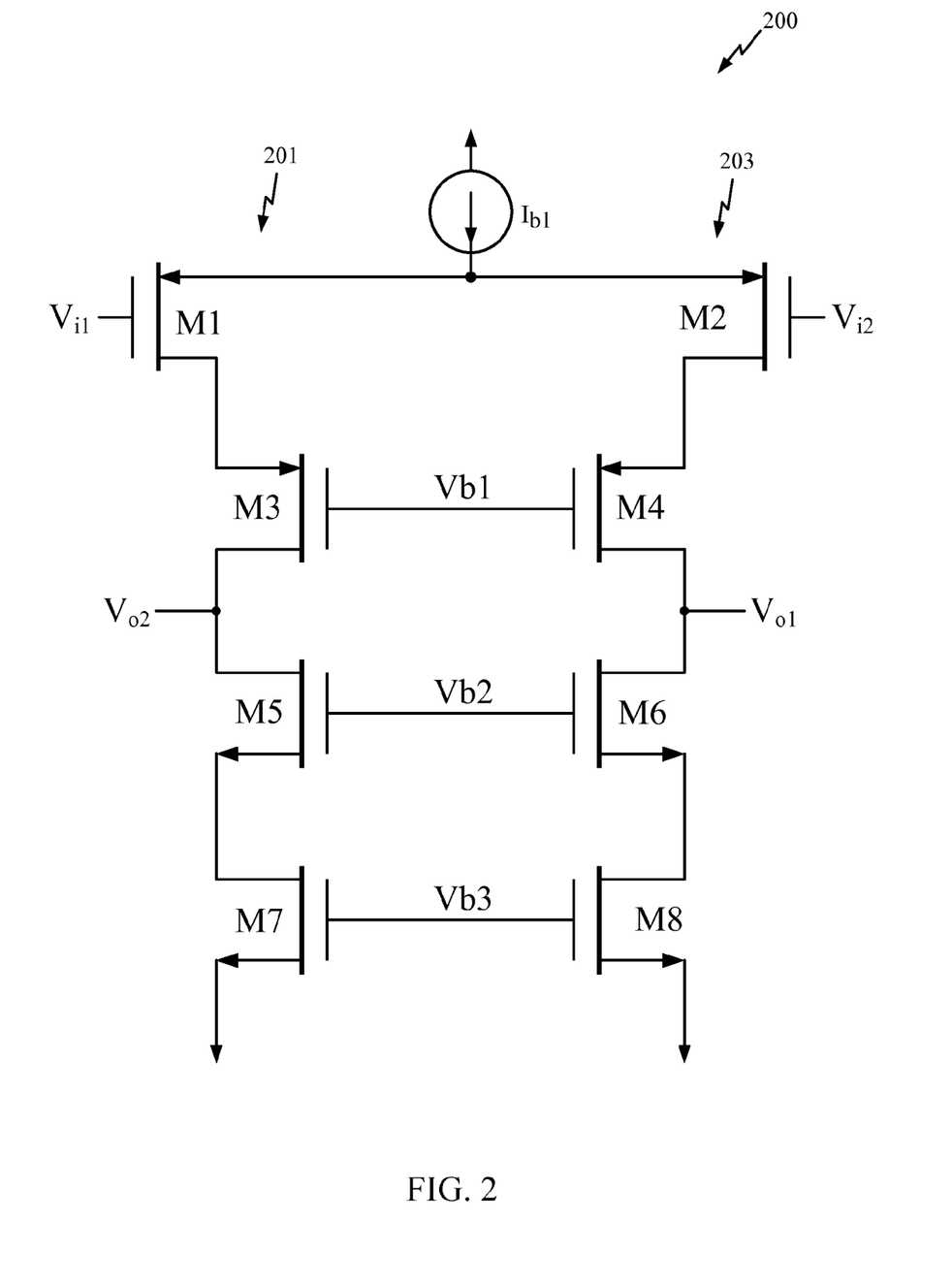
FIG. 2 is a telescopic amplifier including an input device, and first cascode device, and a second cascode device.

FIG. 2 illustrates a telescopic amplifier 200 including a current source $I_{b1}$ and a plurality of transistors M1-M8. More specifically, amplifier 100 includes a differential input including transistors M1 and M2. Transistor M1 is configured to receive an input voltage $V_{i1}$ at its gate and transistor M2 is configured to receive an input voltage $V_{i2}$ at its gate. Each of transistors M1 and M2 may be referred to as an input device. In addition, amplifier 200 includes transistors M3 and M4, each of which may be referred to as a first cascode device or an upper cascode device. Moreover, amplifier 200 includes transistors M5 and M6, each of which may be referred to as a second cascode device or a lower cascode device. Amplifier 200 also transistors M7 and M8, each of which may be referred to as an active load device. Transistors M7 and M8, which are respectively coupled to transistors M5 and M6, are coupled to a ground voltage GRND.

A bias voltage Vb1 may be applied to the gates of transistors M3 and M4, a bias voltage Vb2 may be applied to the gates of transistors M5 and M6, and a bias voltage Vb3 may be applied to the gates of transistors M7 and M8. An output voltage $V_{o1}$ may be coupled between a drain of transistor M4 and a drain of transistor M6, and an output voltage $V_{o2}$ may be coupled between a drain of transistor M3 and a drain of transistor M5. Accordingly, amplifier 100 includes a path 201, which includes current source $I_{b1}$ and transistors M1, M3, M5, and M7, for generating output voltage $V_{o2}$. In addition, amplifier 200 includes another path 203, which includes current source $I_{b1}$ and transistors M2, M4, M6, and M8, for generating output voltage $V_{o1}$.

As noted above, telescopic amplifiers, such as telescopic amplifier 200, include a simple architecture and high bandwidth and, thus, are used widely for moderate gain applications. However, increasing a DC gain of a telescopic amplifier (e.g., via gain boosting, increasing channel lengths, or triple cascoding) has typically required a power and/or an area penalty.

As will be appreciated by a person having ordinary skill in the art, a gain of amplifier 200 may be given by the following equation:

$$G=Gm*(Rup*Rdown/(Rup+Rdown));  \quad (1)$$

wherein G is the gain of amplifier 200, Gm is the transconductance of amplifier 200, Rup is the output impedance of the upper cascode combination (i.e., the combination of transistor M4 and transistor M2), and Rdown is the output impedance of the lower cascode combination (i.e., the combination of transistor M6 and transistor M8).

Further, Rup and Rdown of equation (1) may be defined as follows:

$$Rup=Gmx*rox*roz;  \quad (2)$$

$$Rdown=Gmy*roy*rozn;  \quad (3)$$

wherein Gmx is the transconductance of the upper cascode device (e.g., transistor M4), rox is the output impedance of the upper cascode device (e.g., transistor M4), roz is the output impedance of the input device (e.g., transistor M2), Gmy is the transconductance of the lower cascode device (e.g., transistor M6), roy is the output impedance of the lower cascode device (e.g., transistor M6), and rozn is the output of impedance of the peripheral device (e.g., transistor M8).

As will be appreciated by a person having ordinary skill in the art, to increase a gain of an amplifier, a transconductance and/or an output impedance of one or more devices (e.g., transistors) of the amplifier may be increased. However, increasing a transconductance may require additional power and increasing an output impedance may require a size increase.

Figure 3:
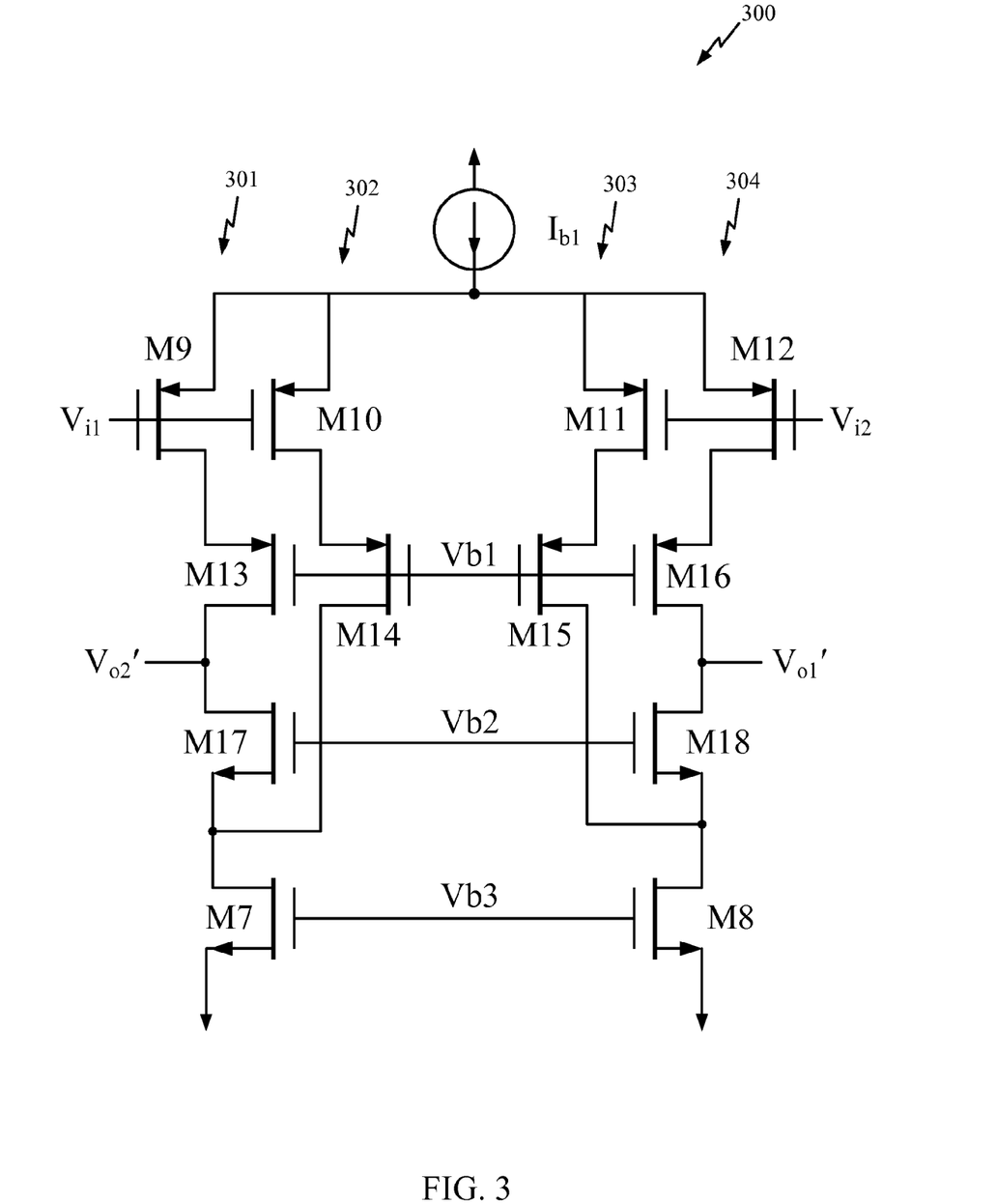
FIG. 3 illustrates an amplifier, according to an exemplary embodiment of the present invention.

FIG. 3 illustrates an amplifier 300, according to an exemplary embodiment of the present invention. Amplifier 300 includes transistors M7-M18, current source $I_{b1}$, input voltages $V_{i1}$ and $V_{i2}$, and output voltages $V_{o1}'$ and $V_{o2}'$. More specifically, amplifier 300 includes a differential input including transistors M9-M12. As illustrated, a gate of each of transistor M9 and transistor M10 is configured to receive input voltage $V_{i1}$, and a gate of each of transistor M11 and transistor M12 is configured to receive input voltage $V_{i2}$. Further, a source of each of transistors M9-M12 is coupled to current source $I_{b1}$. According to one exemplary embodiment of the present invention, a size of each of transistors M9-M12 is a fraction of a size of each of transistors M1 and M2 (see FIG. 2). As a more specific example, a size of each of transistors M9-M12 is a one-half the size of each of transistors M1 and M2.

Further, amplifier 300 includes first cascode circuit including transistors M13-M16 and second cascode circuit including transistors M17 and M18. Each of transistors M13-M16 may be referred to as a first cascode device or an upper cascode device and each of transistors M17 and M18 may be referred to as a second cascode device or a lower cascode device.

Amplifier 300 also includes transistors M7 and M8, each of which, as noted above, may be referred to as an active load device. A drain of transistor M9 is coupled to a source of transistor M13, and a drain of transistor M10 is coupled to a source of transistor M4. Moreover, a drain of transistor M12 is coupled to a source of transistor M16, and a drain of transistor M11 is coupled to a source of transistor M15. A gate of each of transistors M13-M16 is configured to receive a bias voltage Vb1, a gate of each of transistors M17 and M18 is configured to receive a bias voltage Vb2 and a gate of each of transistors M7 and M8 is configured to receive a bias voltage Vb3. In addition, a drain of transistor M13 is coupled to a drain of transistor M17, and a drain of transistor M14 is coupled to a source of transistor M17. Furthermore, a drain of transistor M16 is coupled to a drain of transistor M18, and a drain of transistor M15 is coupled to a source of transistor M18. Additionally, a source of transistor M17 is coupled to a drain of transistor M7, which includes a source coupled to a ground voltage GRND. Also, a source of transistor M18 is coupled to a drain of transistor M8, which includes a source coupled to ground voltage GRND. Output voltage $V_{o1}'$ is coupled between a drain of transistor M16 and a drain of transistor M18, and output voltage $V_{o2}'$ is coupled between a drain of transistor M13 and a drain of transistor M17.

Accordingly, amplifier 300 includes a path 301, which includes current source $I_{b1}$ and transistors M9, M13, M17, and M7 and a path 302, which includes current source $I_{b1}$ and transistors M10, M14, M17, and M7. Moreover, amplifier 300 includes a path 303, which includes current source $I_{b1}$ and transistors M11, M15, M18, and M8, and a path 304, which includes current source $I_{b1}$ and transistors M12, M16, M18, and M8. Paths 301 and 302 are configured to generate output voltage $V_{o2}'$ and paths 303 and 304 are configured to generate output voltage $V_{o2}'$.

According to one exemplary embodiment of the present invention, a size of each of transistors M13-M16 is a fraction of a size of each of transistors M3 and M4 (see FIG. 2), and a size of each of transistors M17 and M18 is a fraction of a size of each of transistors M5 and M6 (see FIG. 2). As a more specific example, a size of each of transistors M13-M16 is a one-half the size of each of transistors M3 and M4, and a size of each of transistors M17 and M18 is a one-half the size of each of transistors M5 and M6.

As will be understood by a person having ordinary skill in the art, in comparison to each path of amplifier 200 (i.e., paths 201 and 203) illustrated in FIG. 2, an amount of current in each path of amplifier 300 (i.e., paths 301-304) may reduced by a factor of two, an output impedance of each upper cascode device may be increased by a factor of two, an output impedance of each lower cascode device may be increased by a factor of two, an output impedance of each input device may be increased by a factor of two, a transconductance of each lower cascode device may reduced by a factor of two, and a transconductance of each upper cascode device may reduced by a factor of two. Thus R'up, which is the output impedance of the upper cascode combination (e.g., transistors M12 and M16), and R'down, which is the output impedance of the lower cascode combination (e.g., transistor M18 and M8), may be defined as follows:

$$R'up=(Gmx'/2)*(2rox)*(2roz); \quad (4)$$

$$R'down=(Gmy'/2)*(2roy)*rozn; \quad (5)$$

wherein Gmx' is the transconductance of the upper cascode devices (e.g., transistors M15 and M16), rox is the output impedance of the upper cascode devices (e.g., transistors M15 and M16), roz is the output impedance of the input devices (e.g., transistor M11 and M12), Gmy' is the transconductance of the lower cascode device (e.g., transistor M18), roy is the output impedance of the lower cascode device (e.g., transistor M18), and rozn is the output of impedance of the active load device (e.g., transistor M8).

Accordingly, in comparison to Rup of amplifier 200, R'up of amplifier 300 is increased by a factor of two, and R' down of amplifier 300 is substantially the same as Rdown of amplifier 200. Further, a gain G' of amplifier 200 may be defined as follows:

$$G'=(Gm'/2+Gm'/2)*(R'up*R'down/(R'up+R'down)); \quad (6)$$

wherein G' is the gain of amplifier 300 and Gm' is the transconductance of amplifier 300.

Figure 4:
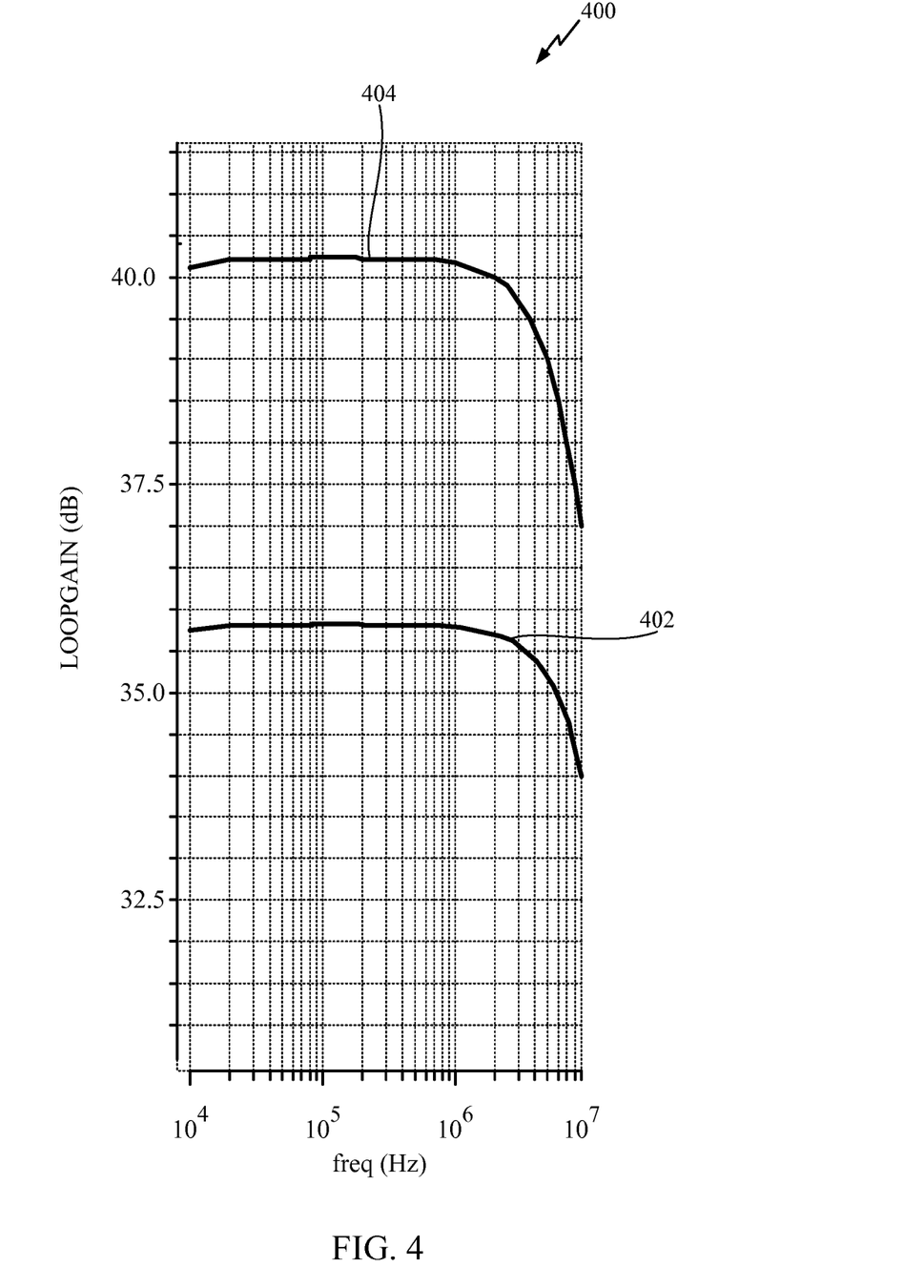
FIG. 4 is a plot illustrating a comparison of gains of two amplifiers relative to input frequency.

Therefore, in comparison amplifier 200, the gain of amplifier 300 is increased. FIG. 4 is a plot 400 illustrating amplifier gain relative to frequency. More specifically, waveform 402 illustrates a gain of a conventional amplifier (e.g., amplifier 100) and waveform 404 illustrates a gain of an amplifier (e.g., amplifier 200) according to an exemplary embodiment of the present invention. As depicted in plot 400, the gain illustrated by waveform 404 is approximately 4 dB higher than the gain illustrated by waveform 402.

Figure 5:
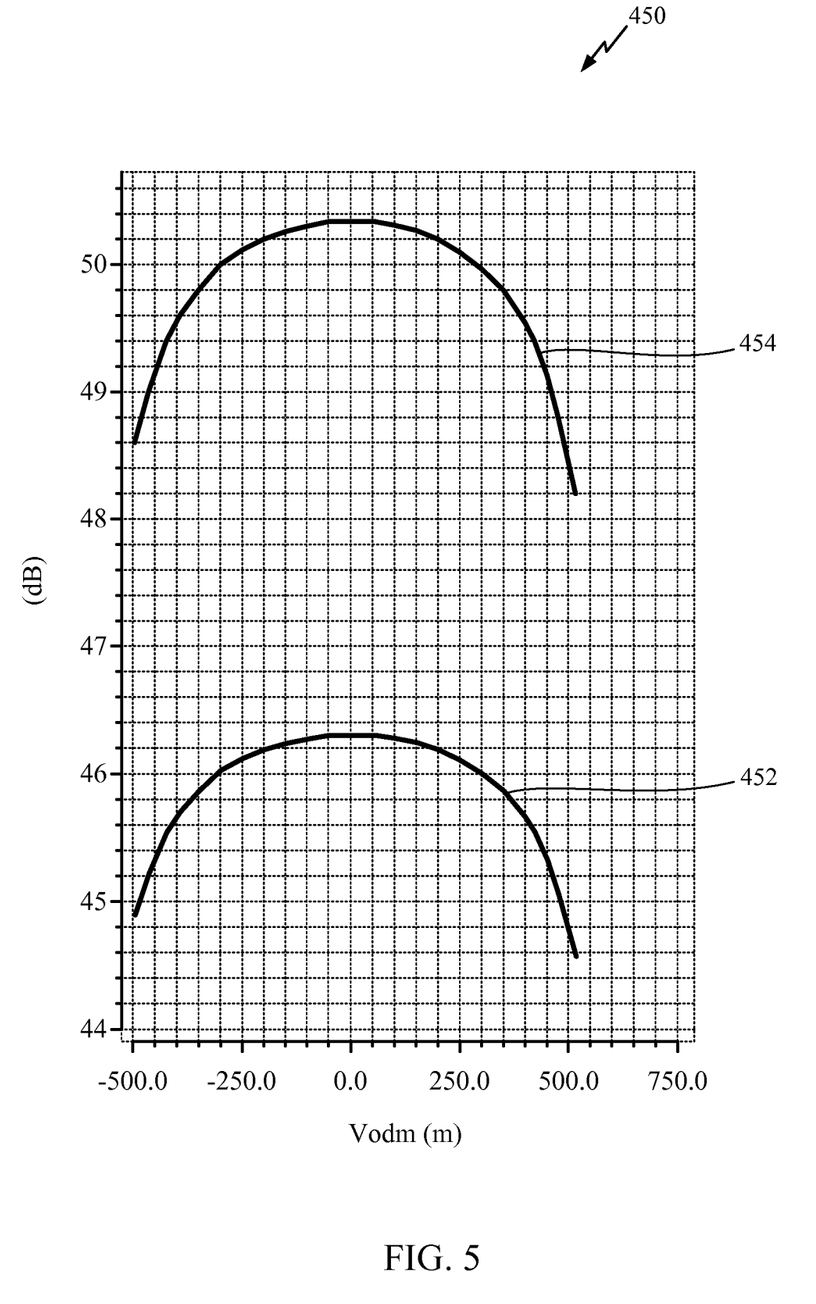
FIG. 5 is another plot illustrating a comparison of gains of two amplifiers relative to output voltage.

FIG. 5 is another plot 450 illustrating amplifier gain relative to an output swing. More specifically, waveform 452 illustrates a gain of a conventional amplifier (e.g., amplifier 200) and waveform 454 illustrates a gain of an amplifier (e.g., amplifier 300) according to an exemplary embodiment of the present invention. As depicted in plot 450, the gain illustrated by waveform 454 is approximately 4 dB higher than the gain illustrated by waveform 452.

Figure 6:
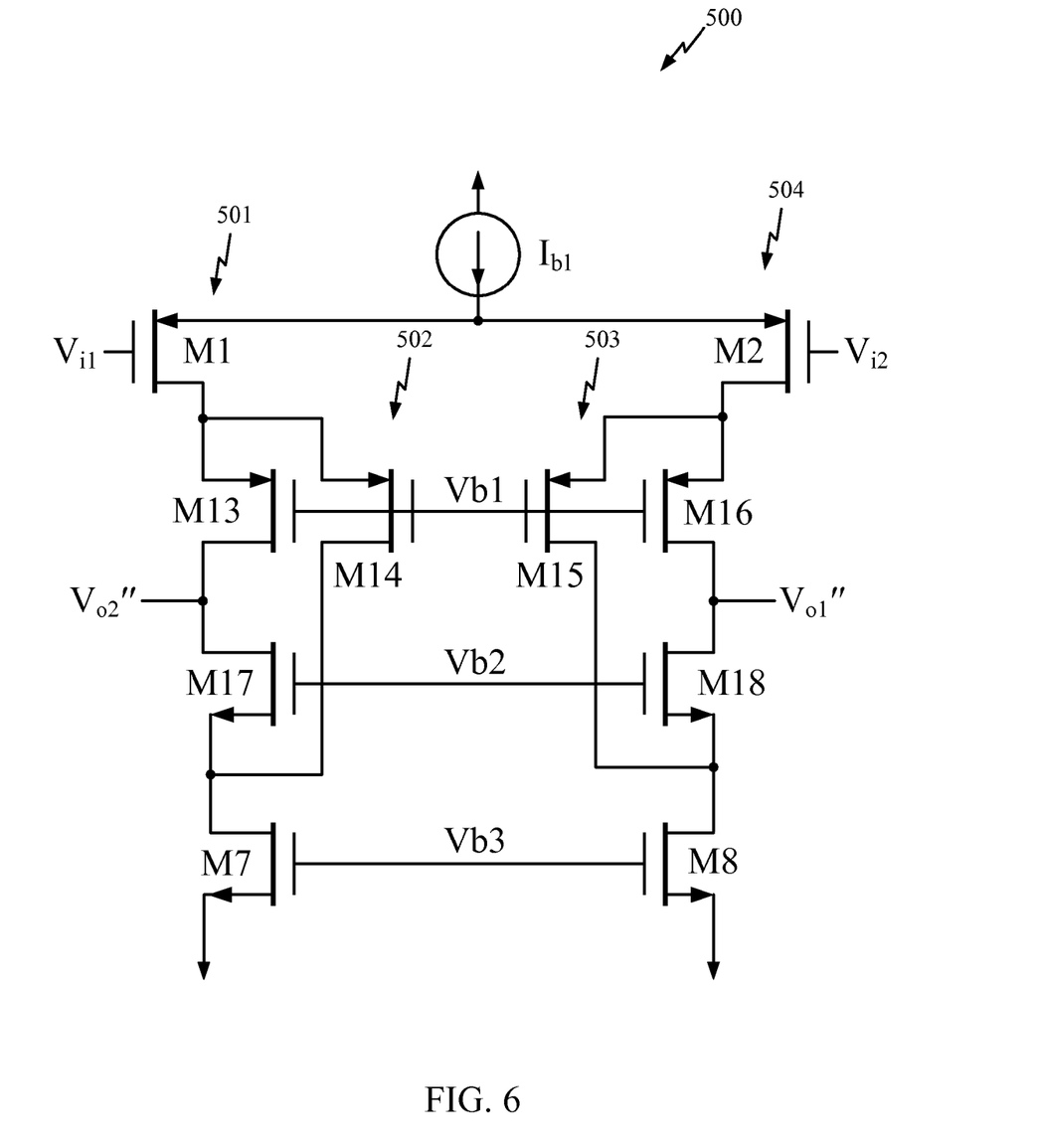
FIG. 6 illustrates another amplifier, in accordance with an exemplary embodiment of the present invention.

FIG. 6 is another amplifier 500, in accordance with an exemplary embodiment of the present invention. Amplifier 500 includes transistors M1, M2, M7, M8, and M13-M18, current source $I_{b1}$, input voltages $V_{i1}$ and $V_{i2}$, and output voltages $V_{o1}''$ and $V_{o2}''$. Similarly to amplifier 300, amplifier 500 includes a first cascode circuit including transistors M13-M16 and a second cascode circuit including transistors M17 and M18. Each of transistors M13-M16 may be referred to as a first cascode device or an upper cascode device and each of transistors M17 and M18 may be referred to as a second cascode device or a lower cascode device.

As illustrated, a gate of transistor M1 is configured to receive input voltage $V_{i1}$, and a gate of transistor M2 is configured to receive input voltage $V_{i2}$. Further, a source of each of transistors M1 and M2 is coupled to current source $I_{b1}$. A drain of transistor M1 is coupled to a source of transistor M13 and a source of transistor M14. Moreover, a drain of transistor M2 is coupled to a source of transistor M15 and a source of transistor M16.

A gate of each of transistors M13-M16 is configured to receive a bias voltage Vb1, a gate of each of transistors M17 and M18 is configured to receive a bias voltage Vb2, and a gate of each of transistors M7 and M8 is configured to receive a bias voltage Vb3. In addition, a drain of transistor M13 is coupled to a drain of transistor M17, and a drain of transistor M14 is coupled to a source of transistor M17. Furthermore, a drain of transistor M16 is coupled to a drain of transistor M18, and a drain of transistor M15 is coupled to a source of transistor M18. Additionally, a source of transistor M17 is coupled to a drain of transistor M7, which includes a source coupled to ground voltage GRND. Also, a source of transistor M18 is coupled to a drain of transistor M8, which includes a source coupled to ground voltage GRND. Output voltage $V_{o1}''$ is coupled between a drain of transistor M16 and a drain of transistor M18, and output voltage $V_{o2}''$ is coupled between a drain of transistor M13 and a drain of transistor M17.

Accordingly, amplifier 500 includes a path 501, which includes current source $I_{b1}$ and transistors M1, M13, M17, and M7 and a path 502, which includes current source $I_{b1}$ and transistors M1, M14, M17, and M7. Moreover, amplifier 500 includes a path 503, which includes current source $I_{b1}$ and transistors M2, M15, M18, and M8, and a path 504, which includes current source $I_{b1}$ and transistors M2, M16, M18, and M8. Paths 501 and 502 are configured to generate output voltage $V_{o2}''$ and paths 503 and 504 are configured to generate output voltage $V_{o1}''$.

As will be understood by a person having ordinary skill in the art, in comparison to each path of amplifier 200 (i.e., paths 201 and 203) illustrated in FIG. 2, an amount of current in each path of amplifier 500 (i.e., paths 501-504) may reduced by a factor of two, an output impedance of each upper cascode device may be increased by a factor of two, an output impedance of each lower cascode device may be increased by a factor of two, a transconductance of each lower cascode device may reduced by a factor of two, and a transconductance of each upper cascode device may reduced by a factor of two. Therefore, in comparison amplifier 200, the gain of amplifier 500 is increased (e.g., around 4 dB).

As will be appreciated by a person having ordinary skill in the art, amplifiers 200, 300, and 500 include PMOS input devices. However, the present invention is not so limited. Rather, as illustrated in FIGS. 7 and 8, the present invention may include an NMOS input devices.

Figure 7:
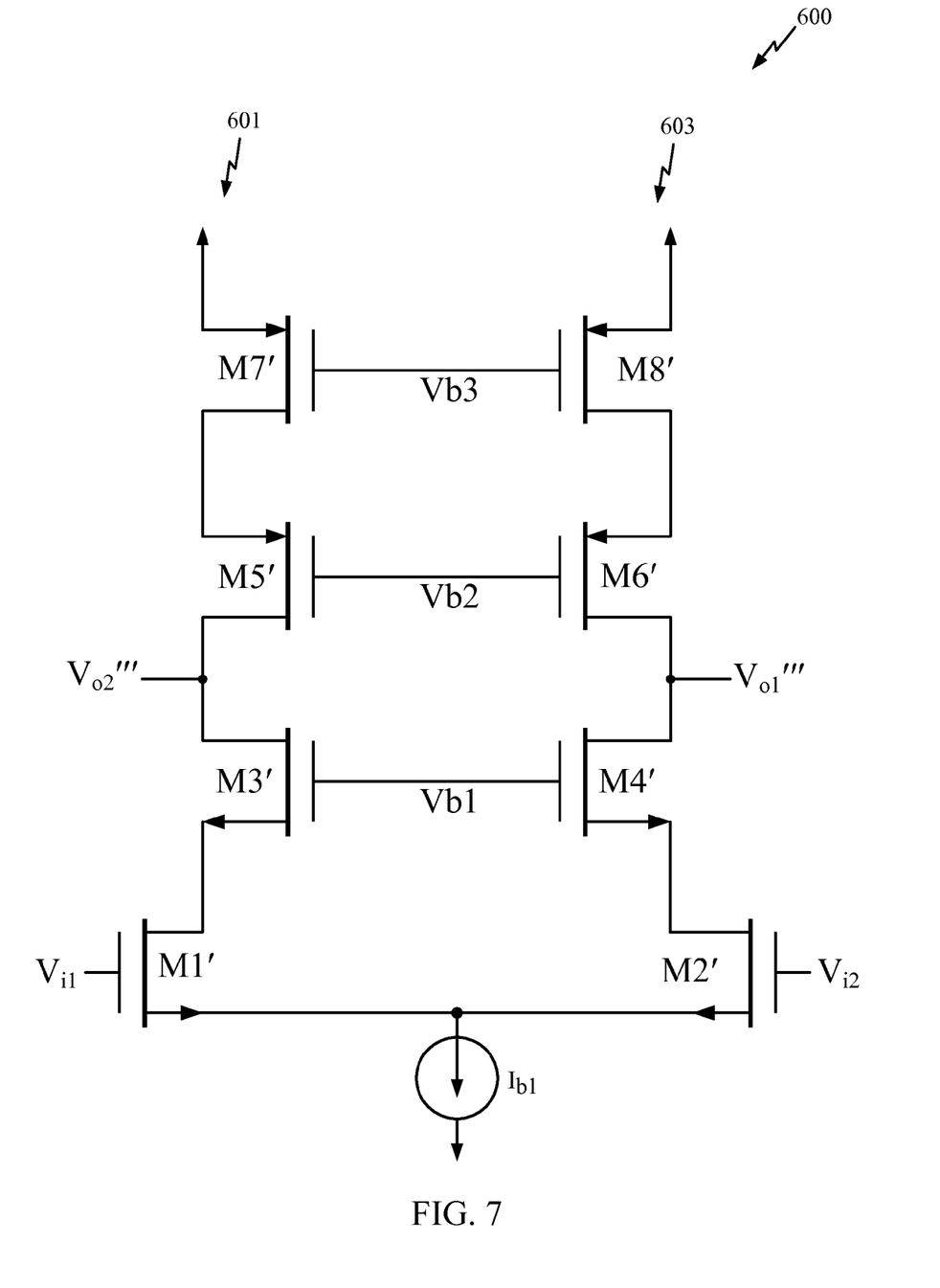
FIG. 7 is another telescopic amplifier including an input device, a first cascode device, and a second cascode device.

FIG. 7 illustrates a telescopic amplifier 600 including current source $I_{b1}$ and a plurality of transistors M1'-M8'. More specifically, amplifier 600 includes a differential input including transistors M1' and M2'. Transistor M1' is configured to receive voltage $V_{i1}$ at its gate and transistor M2' is configured to receive voltage $V_{i2}$ at its gate. Each of transistors M1' and M2' may be referred to as an input device. In addition, amplifier 600 includes transistors M3' and M4', each of which may be referred to as a first cascode device or a lower cascode device. Moreover, amplifier 600 includes transistors M5 and M6, each of which may be referred to as a second cascode device or an upper cascode device. Amplifier 600 also includes transistors M7' and M8', each of which may be referred to as an active load device. Transistors M7' and M8', which are respectively coupled to transistors M5' and M6', are coupled to ground voltage GRND.

Bias voltage Vb1 may be applied to the gates of transistors M3' and M4', bias voltage Vb2 may be applied to the gates of transistors M5' and M6', and bias voltage Vb3 may be applied to the gates of transistors M7' and M8'. An output voltage $V_{o1}'''$ may be coupled between a drain of transistor M4' and a drain of transistor M6', and an output voltage $V_{o2}'''$ may be coupled between a drain of transistor M3' and a drain of transistor M5'. Accordingly, amplifier 600 includes a path 601, which includes current source $I_{b1}$ and transistors M1', M3', M5', and M7', for generating output voltage $V_{o2}'''$. In addition, amplifier 600 includes another path 603, which includes current source $I_{b1}$ and transistors M2', M4', M6', and M8', for generating output voltage $V_{o1}'''$.

Figure 8:
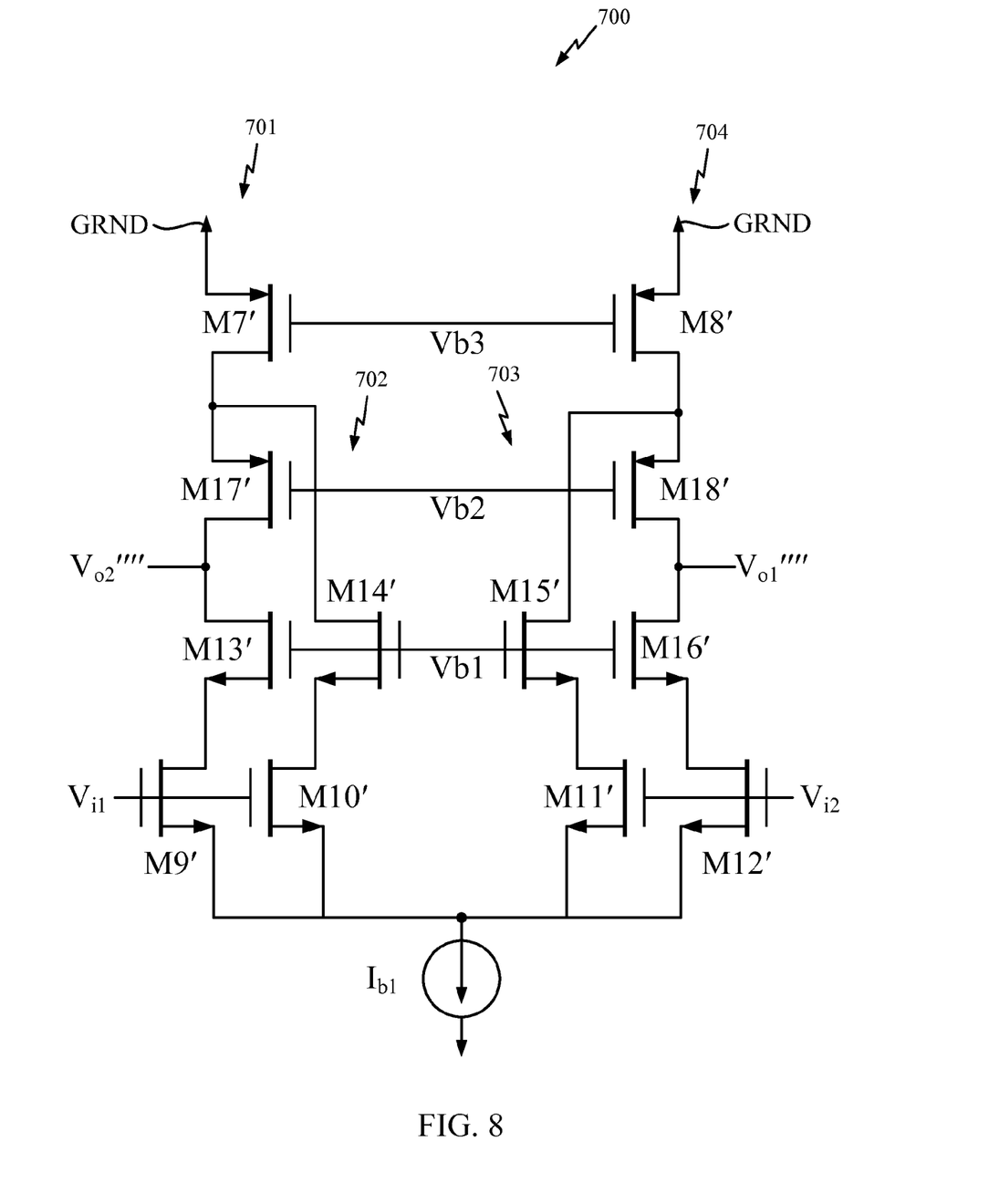
FIG. 8 illustrates yet another amplifier, in accordance with an exemplary embodiment of the present invention.

FIG. 8 illustrates an amplifier 700, according to an exemplary embodiment of the present invention. Amplifier 700 includes transistors M7'-M18', current source $I_{b1}$, input voltages $V_{i1}$ and $V_{i2}$, and output voltages $V_{o1}''''$ and $V_{o1}''''$. More specifically, amplifier 700 includes a differential input including transistors M9'-M12'. As illustrated, a gate of each of transistor M9' and transistor M10' is configured to receive input voltage $V_{i1}$, and a gate of each of transistor M11' and transistor M12' is configured to receive input voltage $V_{i2}$. Further, a source of each of transistors M9'-M12' is coupled to current source $I_{b1}$. According to one exemplary embodiment of the present invention, a size of each of transistors M9'-M12' is a fraction of a size of each of transistors M1' and M2' (see FIG. 7). As a more specific example, a size of each of transistors M9'-M12' is a one-half the size of each of transistors M1' and M2'.

Further, amplifier 700 includes a first cascode circuit including transistors M13'-M16' and a second cascode circuit including transistors M17' and M18'. Each of transistors M13'-M16' may be referred to as a first cascode device or a lower cascode device and each of transistors M17' and M18' may be referred to as a second cascode device or an upper cascode device.

Amplifier 700 also includes transistors M7' and M8', each of which, as noted above, may be referred to as an active load device. A drain of transistor M9' is coupled to a source of transistor M13', and a drain of transistor M10' is coupled to a source of transistor M14'. Moreover, a drain of transistor M12' is coupled to a source of transistor M16', and a drain of transistor M11' is coupled to a source of transistor M15'. A gate of each of transistors M13'-M16' are configured to receive a bias voltage Vb1, a gate of each of transistors M17' and M18' is configured to receive a bias voltage Vb2 and a gate of each of transistors M19' and M20' is configured to receive a bias voltage Vb3. In addition, a drain of transistor M13' is coupled to a drain of transistor M17', and a drain of transistor M14' is coupled to a source of transistor M17'. Furthermore, a drain of transistor M16' is coupled to a drain of transistor M18', and a drain of transistor M15' is coupled to a source of transistor M18'. Additionally, a source of transistor M17' is coupled to a drain of transistor M7', which includes a source coupled to a ground voltage GRND. Also, a source of transistor M18' is coupled to a drain of transistor M8', which includes a source coupled to ground voltage GRND. Output voltage $V_{o1}''$ is coupled between a drain of transistor M16' and a drain of transistor M18', and an output voltage $V_{o2}''$ is coupled between a drain of transistor M13' and a drain of transistor M17'.

According to one exemplary embodiment of the present invention, a size of each of transistors M13'-M16' is a fraction of a size of each of transistors M3' and M4' (see FIG. 7), and a size of each of transistors M17' and M18' is a fraction of a size of each of transistors M5' and M6' (see FIG. 7). As a more specific example, a size of each of transistors M13'-M16' is a one-half the size of each of transistors M3' and M4', and a size of each of transistors M17' and M18' is a one-half the size of each of transistors M5' and M6'.

Accordingly, amplifier 700 includes a path 701, which includes current source $I_{b1}$ and transistors M9', M13', M17', and M7' and a path 702, which includes current source $I_{b1}$ and transistors M10', M14', M17', and M7'. Moreover, amplifier 700 includes a path 703, which includes current source $I_{b1}$ and transistors M11', M15', M18', and M8', and a path 704, which includes current source $I_{b1}$ and transistors M12', M16', M18', and M8'. Paths 701 and 702 are configured to generate output voltage $V_{o2}''$ and paths 703 and 704 are configured to generate output voltage $V_{o1}''''$.

As will be understood by a person having ordinary skill in the art, in comparison to each path of amplifier 600 (i.e., paths 601 and 603) illustrated in FIG. 7, an amount of current in each path of amplifier 700 (i.e., paths 701-704) may reduced by a factor of two, an output impedance of each lower cascode device may be increased by a factor of two, an output impedance of each upper cascode device may be increased by a factor of two, a transconductance of each lower cascode device may reduced by a factor of two, and a transconductance of each upper cascode device may reduced by a factor of two. Therefore, in comparison amplifier 600, the gain of amplifier 700 is increased by, for example only, 4 dB.

Figure 9:
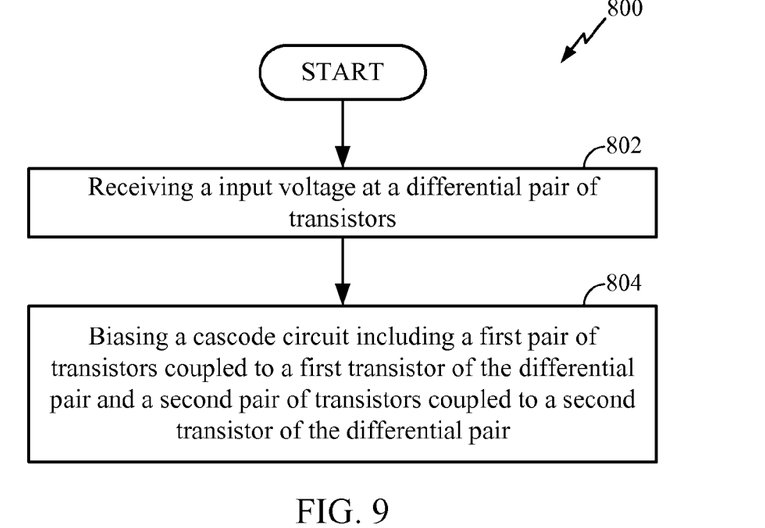
FIG. 9 is a flowchart illustrating a method, according to an exemplary embodiment of the present invention.

FIG. 9 is a flowchart illustrating a method 800, in accordance with one or more exemplary embodiments. Method 800 may include receiving an input voltage at a differential pair of transistors (depicted by numeral 802). Method 800 may also biasing a cascode circuit including a first pair of transistors coupled to a first transistor of the differential pair and a second pair of transistors coupled to a second transistor of the differential pair (depicted by numeral 804).

Figure 10:
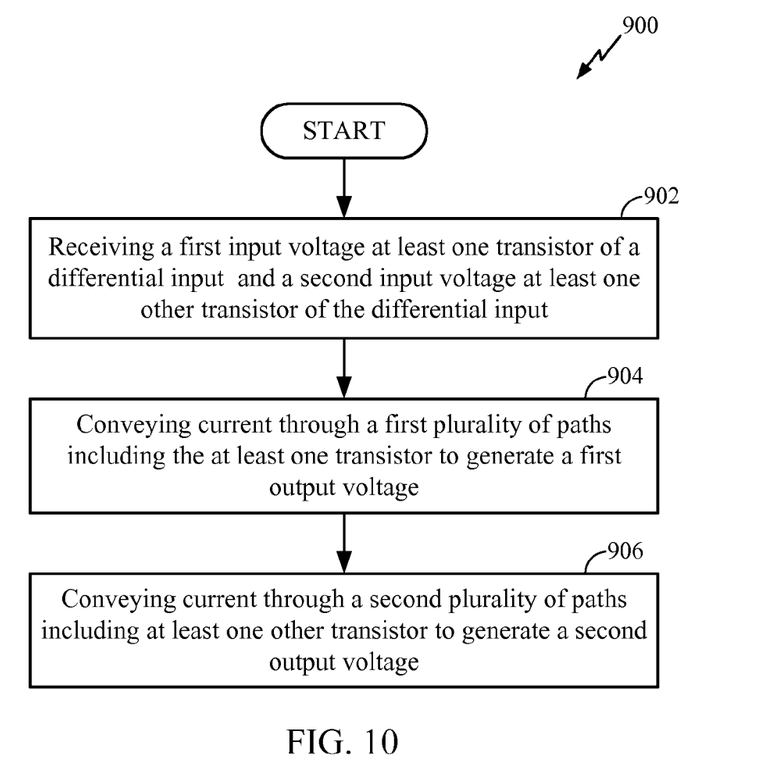
FIG. 10 is a flowchart illustrating another method, according to an exemplary embodiment of the present invention.

FIG. 10 is a flowchart illustrating another method 900, in accordance with one or more exemplary embodiments. Method 900 may include receiving a first input voltage at least one transistor of a differential input device and a second input voltage at least one other transistor of the differential input device (depicted by numeral 902). Method 900 may also include conveying current through a first plurality of paths including the at least one transistor to generate a first output voltage (depicted by numeral 904). In addition, method 900 may include conveying current through a second plurality of paths including at least one other transistor to generate a second output voltage (depicted by numeral 906).

As described herein, the present invention may increase a DC gain of an amplifier significantly (e.g., by 4 dB) with no power or area penalty. Further, if a bandwidth of the amplifier is limited by the parasitic capacitor of cascode devices, the present invention may increase the amplifier bandwidth as well, since the amplifier may have smaller cascode devices. In addition, it is noted that although an amplifier, according to one or more exemplary embodiments of the present invention, may have a reduced phase modulation (PM), the PM for a telescopic single-stage amplifier is usually around 90 degree and, therefore, and few degrees PM reduction may not degrade stability. It is further noted that the amplifiers described above with reference to FIGS. 3, 6, and 8 may include slew-rates that are substantially the same as slew-rates of conventional telescopic amplifier. In addition, the present invention may be used to maintain the DC gain while reducing the length of cascode devices. Accordingly, significant bandwidth improvement may be provided with no increase in power consumption.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. An apparatus, comprising:
a differential pair of input transistors; and
a cascode circuit including a serially-connected first pair of transistors coupled to a first transistor of the differential pair and a serially-connected second pair of transistors coupled to a second transistor of the differential pair, the cascode circuit further including a first current path including at least a fifth transistor in parallel with the first pair of transistors and a second current path including at least a six transistor in parallel with the second pair of transistors.

2. The apparatus of claim 1, wherein the cascode circuit comprises an upper cascode circuit, wherein the first pair of transistors of the upper cascode circuit includes a first transistor including a drain coupled to a drain of a lower cascode device and second transistor including a drain coupled to a source of the lower cascode device.

3. The apparatus of claim 1, further comprising another cascode circuit including a first transistor coupled to the first pair of transistors of the cascode circuit and a second transistor coupled to the second pair of transistors of the cascode circuit, the first transistor of the another cascode circuit and the second transistor of the another cascode circuit configured to receive a common gate voltage.

4. The apparatus of claim 3, wherein a first transistor of the first pair of transistors of the cascode circuit includes a drain coupled to a drain of the first transistor of the another cascode circuit and a second transistor of the first pair of transistors of the cascode circuit includes a drain coupled to a source of the first transistor of the another cascode circuit.

5. The apparatus of claim 4, wherein a first transistor of the second pair of transistors of the cascode circuit includes a drain coupled to a drain of the second transistor of the another cascode circuit and a second transistor of the second pair of transistors of the cascode circuit includes a drain coupled to a source of the second transistor of the another cascode circuit.

6. The apparatus of claim 1, wherein each of the first pair of transistors of the cascode circuit includes a source coupled to a drain of a first transistor of the differential pair of input transistors and each of the second pair of transistors of the cascode circuit includes a source coupled to a drain of a second transistor of the differential pair of input transistors.

7. The apparatus of claim 1, wherein the differential pair of input transistors includes a first pair of transistors configured to receive a first input voltage and a second pair of transistors configured to receive a second input voltage.

8. The apparatus of claim 7, wherein each transistor of the first pair of transistors of the differential pair of input transistors and each transistor of the second pair of transistors of the differential pair of input transistors includes a source coupled to a common current source.

9. The apparatus of claim 7, wherein a drain of a first transistor of the first pair of transistors of the differential pair of input transistors and a drain of a second transistor of the first pair of transistors of the differential pair of input transistors are respectively coupled to a source of a first transistor of the first pair of transistors of the cascode circuit and a source of a second transistor of the first pair of transistors of the cascode circuit.

10. The apparatus of claim 9, wherein a drain of a first transistor of the second pair of transistors of the differential pair of input transistors and a drain of a second transistor of the second pair of transistors of the differential pair of input transistors are respectively coupled to a source of a first transistor of the second pair of transistors of the cascode circuit and a source of a second transistor of the second pair of transistors of the cascode circuit.

11. The apparatus of claim 7, wherein the cascode circuit comprises an upper cascode circuit, wherein the first pair of transistors of the upper cascode circuit includes a first transistor including a drain coupled to a drain of a first transistor of a lower cascode circuit and second transistor including a drain coupled to a source of the first transistor of the lower cascode circuit.

12. The apparatus of claim 11, wherein the second pair of transistors of the upper cascode circuit includes a first transistor including a drain coupled to a drain of a second transistor of the lower cascode device and second transistor including a drain coupled to a source of the second transistor of the lower cascode device.

13. The apparatus of claim 1, wherein the first pair of transistors coupled to the first transistor of the differential pair forms a first plurality of current paths to generate a first output and the second pair of transistors coupled to the second transistor of the differential pair forms a second plurality of currents paths to generate a second output.

14. The apparatus of claim 13, wherein the first plurality of current paths comprises:
a first current path extending from a current source through the at least one transistor of the differential pair of input transistors and a first transistor of the first pair of transistors of the cascode circuit to a drain of a transistor of a lower cascode circuit; and
a second current path extending from the current source through the at least one transistor of the differential pair of input transistors and a second transistor of the first pair of transistors of the cascode circuit to a source of the transistor of the lower cascode circuit.

15. The apparatus of claim 14, wherein the second plurality of current paths comprises:
a third current path extending from the current source through the at least one other transistor of the differential pair of input transistors and a first transistor of the second pair of transistors of the cascode circuit to a drain of another transistor of the lower cascode circuit; and
a fourth current path extending from the current source through the at least one other transistor of the differential pair of input transistors and a second transistor of the second pair of transistors of the cascode circuit to a source of the another transistor of the lower cascode circuit.

16. A method, comprising:
receiving an input voltage at a differential pair of transistors; and
biasing a cascode circuit including a serially-connected first pair of transistors coupled to a first transistor of the differential pair and a serially-connected second pair of transistors coupled to a second transistor of the differential pair, the cascode circuit further including a first current path including at least a fifth transistor in parallel with the first pair of transistors and a second current path including at least a six transistor in parallel with the second pair of transistors.

17. The method of claim 16, wherein receiving an input voltage comprises receiving a first differential input at a first pair of transistors and receiving a second differential input at a second pair of transistors.

18. A device, comprising:
means for receiving an input voltage at a differential pair of transistors; and
means for biasing a cascode circuit including a serially-connected first pair of transistors coupled to a first transistor of the differential pair and a serially-connected second pair of transistors coupled to a second transistor of the differential pair, the means for biasing the cascode circuit further including a first current path including at least a fifth transistor in parallel with the first pair of transistors and a second current path including at least a six transistor in parallel with the second pair of transistors.

19. The device of claim 18, wherein the means for biasing comprises means for biasing an upper cascode circuit including one transistor including a drain coupled to a drain of a lower cascode device and another transistor including a drain coupled to a source of the lower cascode device.

* * * * *